United States Patent

[11] 3,585,535

[72] Inventor George A. Senf
Williamstown, Mass.
[21] Appl. No. 843,476
[22] Filed July 22, 1969
[45] Patented June 15, 1971
[73] Assignee Sprague Electric Company
North Adams, Mass.

[54] MICROSTRIP DELAY LINE
6 Claims, 2 Drawing Figs.

[52] U.S. Cl. .......... 333/29, 333/84 M, 317/101
[51] Int. Cl. .......... H01p 3/08, H03h 7/34
[50] Field of Search .......... 333/29, 31, 73, 23, 84; 330/57

[56] References Cited
UNITED STATES PATENTS
2,659,052 11/1953 Bess .......... 333/23 X
2,688,119 8/1954 Gere .......... 333/73 X
2,751,558 6/1956 Grieg et al. .......... 333/84 X
3,093,805 6/1963 Osifchin et al. .......... 333/84
FOREIGN PATENTS
801,597 9/1958 Great Britain .......... 333/29
OTHER REFERENCES
IBM TECHNICAL DISCLOSURE BULLETIN Vol 9 No. 3 August 1966, pages 266— 267

*Primary Examiner*—Herman Karl Saalbach
*Assistant Examiner*—Marvin Nussbaum
*Attorneys*—Connolly & Hutz, Vincent H. Sweeney, James Paul O'Sullivan and David R. Thornton

ABSTRACT: A microstrip delay line where both active conductive lines forming a series inductance and conductive ground strips in capacitive relation to the active lines are deposited on the same side of a ceramic substrate. The characteristic impedance of the microstrip delay line is controlled by altering the distance between the active conductive line and the conductive ground strips which changes the fringing of electrostatic flux.

PATENTED JUN 15 1971 3,585,535

MICROSTRIP DELAY LINE

BACKGROUND OF THE INVENTION

This invention relates to microstrip delay lines, and in particular to such lines where all conductive patterns are deposited on the same side of a ceramic base.

The rapid advancement in the field of high speed digital integrated circuits has produced a requirement for miniaturized delay lines having the requisite high frequency characteristics. Previous microstrip delay lines using standard ceramic capacitor dielectric material and conforming to requisite high frequency characteristics have employed parallel conductive plates in which the active line comprising a series inductance was formed by a conductive spiral on one surface of a ceramic substrate with a distributed shunt capacitance provided by a conductive ground plane on the opposing substrate surface.

It is therefore one object of the present invention to provide a microstrip delay line having the requisite high frequency characteristics without parallel conductive patterns on opposite sides of a substrate.

It is a further object that the characteristic impedance of the delay line may be variable while still maintaining a uniform ceramic substrate thickness.

It is another object that a characteristic impedance in at least the 93 ohm range may be achieved by the sole use of a ceramic dielectric substrate material without including magnetic materials.

SUMMARY OF THE INVENTION

Broadly, a delay line constructed in accordance with this invention comprises a series inductance formed as a conductive spiral on the surface of a ceramic substrate and a distributed shunt capacitance provided by depositing a conductive ground strip on the same surface and evenly spaced to the active series inductance line for each spiral turn. The ground strips are interconnected to a common output terminal and the ground crossover points are insulated from the active lines by a glass frit glaze of other insulative material over the surface of the substrate and active conductive lines.

The advantage of having both active conductive lines and ground conductive strips on the same surface of the substrate is that the characteristic impedance of the delay line can be altered by varying the separation between the active conductive line and the conductive ground strip, therefore allowing the ceramic substrate to remain at a constant thickness. Also having both active and ground conductors deposited on the same side of the ceramic substrate simplifies construction techniques by eliminating the necessity of aligning parallel plates and by permitting each conductor to be deposited by a silk screening or other process. Further the desired characteristic impedance levels can be achieved using standard ceramic capacitor dielectric material without including magnetic materials which are another source of variables.

BRIEF DESCRIPTION OF THE DRAWING

A further understanding can be achieved from a study of the following description and drawings wherein.

DESCRIPTION OF THE PREFERRED EMBODIMENT

Figure 1:
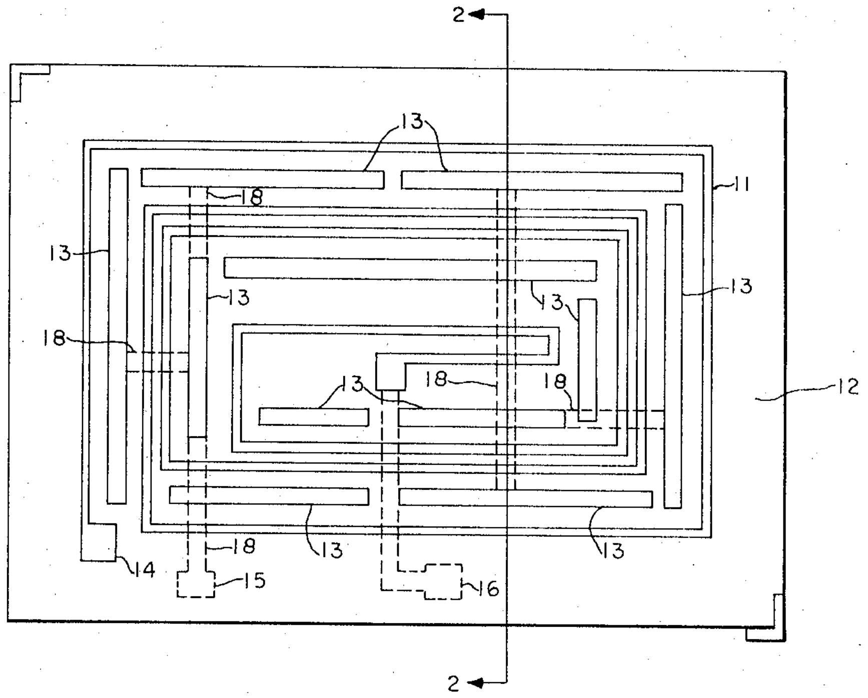
FIG. 1 is a pictorial representation of a microstrip delay line.

A microstrip delay line is essentially a transmission line wherein the active inductance line is separated from and evenly spaced from a ground line by a dielectric material FIG. 1 shows a microstrip delay line where both the active line and the ground strips are deposited onto the same surface of a substrate. The active line is formed by depositing a spiral conductor 11 onto the surface of substrate 12 and the ground strips are formed by depositing conductive strips 13 onto the surface of substrate 12. The ground strips are spaced at an even distance from the active line within a single spiral and afford a characteristic impedance along the length of the delay line. The input pulse is applied between terminal 14 and the ground terminal 15 and the output pulse is measured between terminal 16 and the ground terminal 15.

Figure 2:
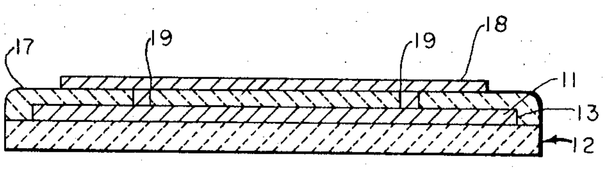
FIG. 2 shows a cross section view of the microstrip delay line along section line 2–2 of FIG. 1.

FIG. 2 shows a cross section of the microstrip delay line. The active inductance line 11 and the ground strips 13 may be formed by one of two well-known techniques: silk screening or "printing" by metal deposition, masking and etching. The defined pattern is then plated with gold, copper or other metal to bring the DC resistance of the pattern to the desired level. The surface of the ceramic substrate 12 and the conductive lines deposited on the substrate are coated with an insulative material such as glass frit glaze 17 having a dielectric constant of 8. The individual ground strips 13 are interconnected on the surface of the glaze by depositing interconnecting conductive strips 18, using either of the two previous techniques, onto the surface of the glaze as shown in FIG. 1 which connect with the individual ground strips 13 through holes 19 in the glaze as shown in the cross section of FIG. 2.

The spiral design (number of turns, segment width), the spacing between the active inductance line and the ground strip; and the substrate qualities (permittivity, strength) are determined by particular design requirement. The fringing electrostatic flux between the active inductance line and the ground strips controls the characteristic impedance of the delay line. The impedance is a function of the width of the active inductive line and its separation from the ground strip. Therefore increasing the distance between the active inductive line and the ground strip proportionately increases the characteristic impedance of the delay line. Also the active inductive lines in that part of the spiral that parallel each other and are not separated by ground strips tend to interact causing an increase in the characteristic impedance. This allows for a compact design by permitting a shorter distance between the active inductive line and ground strips which compensates for the increased impedance caused by the interaction of the parallel active inductive lines. Further adjustment of the characteristic impedance can be obtained by the use of thicker or thinner substrate materials which would alter the fringing of electrostatic flux. Also the use of other substrate materials with different dielectric constants can be used to achieve desired impedance levels. Characteristic impedances in the 93 ohm range were achieved by these techniques using standard ceramic capacitor dielectric material *c* 25 and without including magnetic materials. A time delay of 1.5 N. sec. was recorded with an output risetime of 1 N. sec. for an input risetime of 0.8 N. sec.

Changes and modifications may be made in the above-described details without departing from the spirit and scope of the invention. For example ferrite slabs can be substituted for standard ceramic capacitor dielectric material thereby doubling the impedance. Also potting in powdered iron filled epoxy approximately doubles the impedance.

What I claim is:

1. A delay line comprising:

a. a substrate of dielectric material;

b. a first electrical conductor disposed to form a series inductance spiral pattern on a surface of said substrate;

c. at least one second electrical conductor disposed on said surface and spaced apart from said first conductor so as to be in capacitive relation to said first conductor; and d. connecting means providing outside electrical contact to said first and second conductors.

2. A delay line as described in claim 1 including an insulative coating disposed over the surface of said substrate and said first and second electrical conductors, including holes through said coating for providing access to said first and second electrical conductors, and wherein said connecting means includes a third electrical conductor disposed on said insulative coating and connected to said first and second conductors.

3. A delay line as described in claim 2 where said dielectric substrate material is ceramic.

4. A delay line as described in claim 2 where said insulative coating is glass frit glaze.

5. A delay line as described in claim 3 wherein said first electrical conductor and said second electrical conductor are silk screened thin films of conductive material on the same surface of said ceramic substrate.

6. A delay line as described in claim 3 wherein said first electrical conductor and said second electrical conductor are thin films printed on the same surface of said ceramic substrate by metal deposition, masking and etching.